United States Patent [19]
Ninomiya et al.

[11] Patent Number: 4,522,674
[45] Date of Patent: Jun. 11, 1985

[54] SURFACE TREATMENT APPARATUS

[75] Inventors: Ken Ninomiya, Nakano; Keizo Suzuki, Hachioji; Shigeru Nishimatsu, Kokubunji, all of Japan

[73] Assignee: Hitachi, Ltd., Tokyo, Japan

[21] Appl. No.: 573,325

[22] Filed: Jan. 24, 1984

[30] Foreign Application Priority Data

Jan. 24, 1983 [JP] Japan .................................. 58-8731

[51] Int. Cl.$^3$ ...................... B44C 1/22; C03C 15/00; C03C 25/06; C23C 13/08
[52] U.S. Cl. .................................. 156/345; 118/724; 118/728; 118/50.1; 118/620; 156/643; 156/646; 204/298; 204/192 E; 427/38
[58] Field of Search .............. 156/643, 646, 345, 635; 204/192 E, 164, 298, 192 C; 427/38, 39; 118/724, 728, 620, 50.1

[56] References Cited

U.S. PATENT DOCUMENTS 4,183,780  1/1980  McKenna et al. .............. 156/646 X
4,259,145  3/1981  Harper et al. .................. 156/345 X Primary Examiner—William A. Powell
Attorney, Agent, or Firm—Antonelli, Terry & Wands

[57] ABSTRACT

A gas is introduced into a surface treatment chamber and is activated therein. The surface of a specimen placed in the surface treatment chamber is treated by using reactive species generated by this activation. A means of supplying controllable energy such as the energy of heat, light, or electron beams is provided in a stage preceding the surface treatment chamber so as to activate the gas beforehand. The pre-activated gas is introduced into the surface treatment chamber and is activated again therein.

10 Claims, 12 Drawing Figures

SURFACE TREATMENT APPARATUS

BACKGROUND OF THE INVENTION

The present invention relates to an improvement in a surface treatment apparatus such as an etching apparatus or a deposition apparatus, and in particular it relates to a means for activating a material gas, which is suitable for improving the treatment speed (etching speed, deposition speed, etc.) and controlling the reactions relating to the surface treatment.

Current surface treatment apparatuses, such as plasma etching apparatuses or plasma deposition apparatuses, are required to improve the treatment speed and to control the reactions of the surface treatment. These demands are directly related to improvements in mass-producibility, reproducibility, and controllability.

FIGS. 1 and 2 illustrate schematic diagrams of plasma etching apparatuses. The apparatus in FIG. 1 uses the RF discharge (13.56 MHz), while the apparatus in FIG. 2 uses magneto microwave discharge.

In FIG. 1, parallel plate electrodes 12a and 12b facing each other are provided in a surface treatment chamber 11. A material gas is introduced into the surface treatment chamber 11 through a valve 13, and then RF discharge occurs between the electrodes 12a and 12b.

In FIG. 2, microwaves generated by a magnetron 22 are led into a quartz discharge tube 25, through a waveguide 23. A magnetic field is formed by a coil 26 within the discharge tube 25. The interior of the waveguide 23 is kept at atmospheric pressure, while the interior of the discharge tube 25 and the surface treatment chamber 21 is evacuated so that they are in a vacuum. The material gas which will be subjected to the discharge is supplied through a valve 24 into the discharge tube 25, wherein a microwave discharge is generated. The microwaves are absorbed efficiently by the plasma by adjusting the magnetic flux density, so that a stable high-density plasma is obtained. A specimen 28 placed on a turn table 27 in the surface treatment chamber 21 is subjected to treatment such as etching by reactive species generated by the microwave discharge.

According to most of the methods of introducing the material gas into the surface treatment chamber in these apparatuses, the material gas is introduced, as it is, into the surface treatment chamber 11 or 21, or the discharge tube 25. A similar method is also used in a plasma deposition apparatus. When the ionization rate Y in these apparatuses is defined as $Y = n_p/(n_p + n_o)$
$n_p$: plasma density
$n_o$: density of material gas, the value of Y is a few percent even in the magneto microwave plasma etching apparatus shown in FIG. 2 in which the ionization efficiency is high (K. Sujuki et al., Jpn. J. Appl. Phys. 16, 1979 (1977)). The value of Y is even smaller for the parallel plate plasma etching apparatus using RF discharge shown in FIG. 1. In addition to reactive ions, there are various neutral active species in a plasma. However, most of the material gas particles are not dissociated. In order to improve the speed of treatment, it is necessary to dissociate the particles of material gas efficiently and ionize them.

To provide an efficient dissociation and further ionization of the particles of the material gas, it has been proposed to excite the particles of the material gas preliminarily by RF discharges in a preceding stage from which the particles are sent to the discharge tube or the surface treatment chamber. A concrete example of this preliminary excitation is shown in FIG. 3. As shown in the figure, a preliminary treatment chamber 33 is provided as the stage before a surface treatment chamber 31 within which parallel plate electrodes 32a and 32b are provided with a specimen 38 placed on the electrode 32b. A pair of parallel plate electrodes 35a and 35b are provided in the preliminary treatment chamber 33, whereby RF discharge is generated. With such a construction, part of the gas introduced into the preliminary treatment chamber 33 through a valve 34 is excited and dissociated to promote the dissociation and ionization of the particles of gas in the surface treatment chamber.

As described above, the preliminary excitation by RF discharge has an effect on the improvement in the speed of treatment. This method is accompanied, however, by the difficulty in controlling the reaction. The electrons in a discharge usually have a wide range of kinetic energy, so that almost all the bonds between the atoms consisting of particles of the material gas are broken by the RF discharge. Accordingly, it is impossible to generate specific species and send only those specific reactive species into the surface treatment chamber. Since many different kinds of reactive species are sent into the surface treatment chamber and subjected to further discharge, very many kinds of reactive species are generated in the surface treatment chamber. As a result, the chemical reactions become very complicated when surface treatment is performed, the controllability of the reactions is reduced, and the reproducibility of the surface treatment is also reduced.

Therefore, preliminary excitation by using RF discharge has a disadvantage that it is accompanied by a difficulty in controlling the surface reactions, although it improves the speed of treatment.

SUMMARY OF THE INVENTION

An object of the present invention is to furnish a surface treatment apparatus provided with means for preliminary excitation which can control easily the reactions in a surface treatment chamber and increase the speed of treatment.

When applied to an apparatus for surface treatment wherein a material gas is supplied to a surface treatment chamber and activated therein, and the surface of a specimen placed in the surface treatment chamber is treated by reactive species generated by the activation, a characteristic feature of the present invention lies in a surface treatment apparatus characterized in that a means for supplying controllable energy to the gas is provided in a stage preceding the surface treatment chamber, and gas containing reactive species obtained by the preliminary activation of the gas by the energy is supplied to the surface treatment chamber and activated again therein, and the surface of the specimen is treated by it.

Since the means of supplying the controllable energy, such as heat, light, or electron beams, is provided in a stage preceding the surface treatment according to the present invention, the atoms and molecules of the gas can be excited and dissociated beforehand so as to promote the excitation and dissociation thereof in the surface treatment chamber, and thus the speed of surface treatment can be improved. Moreover, the excitation and dissociation of the gas in the preceding stage can be performed selectively by selecting the temperature, wavelength, etc., as appropriate, and thus chemical reactions in the surface treatment chamber can be controlled.

BRIEF DESCRIPTION OF THE DRAWINGS

FIGS. 5 to 12 are illustrations each explaining other embodiments of the present invention of which: FIGS. 5 to 7 illustrate mechanisms using heat; FIGS. 8 and 9 mechanisms using laser beams; FIG. 10 a mechanism using a lamp as the light source; FIG. 11 a mechanism using electron beams; and FIG. 12 a mechanism using heat and a light provided from a lamp.

Figure 1:
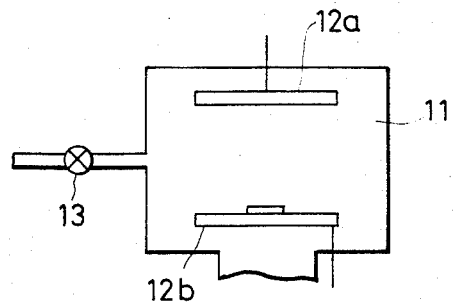
FIG. 1 is an illustration explaining a parallel plate plasma etching apparatus using RF discharge.

The principles of the present invention will be described first.

As described previously, the disadvantage of preliminary excitation using RF or microwave discharge is that the chemical reactions in the surface treatment become so complicated that it is difficult to control them. This is because almost all the bonds between the atoms consisting of the particle of the material gas are broken by the discharge in the preliminary excitation, so that too many kinds of reactive species are generated and are introduced in the surface treatment chamber.

The present invention is designed to improve the controllability of the reactions and the speed of treatment by performing the preliminary excitation by heat, light, electron beams or the like, whose energy can be controlled. A method of heating the material gas beforehand, for instance, enables a control of the preliminary excitation and dissociation of gas particles by controlling the temperature based on an equilibrium constant and dissociation constant which are known. Irradiation of monochromatic light and electron beams to the material gas enables the excitation of the atoms and molecules of the gas to specific energy levels, or the breaking of specific bonds in the molecules. This means that the employment of heat, light, electron beams, or the like for the preliminary excitation and dissociation of the material gas enables (1) an improvement in the speed of treatment, and (2) an improvement in the controllability of the surface treatment reactions. The latter improvement can be obtained because the preliminary excitation and dissociation of the atoms and molecules of the gas is more controllable in this method than in the method wherein RF discharge is employed for the preliminary excitation.

The principles of the present invention will now be described in detail with reference to a concrete example. Fluorine gas ($F_2$), which is the simplest etching gas, is employed herein as an example.

Although stable at room temperature, $F_2$ is dissociated partly by heat into fluorine atoms (F) as its temperature increases. Assuming the thermal equilibrium state such as $$F_2 \rightleftharpoons 2F,$$

a calculation using the thermal equilibrium constant K (JANAF Thermochemical Tables, 1965) shows that about 40% of the $F_2$ is dissociated thermally into F under the conditions of 100 Torr and 700° C. Any thermal dissociation rate can be obtained by controlling the temperature.

When an ultraviolet laser beam is employed as a light source for the dissociation, the following formula holds approximately for the dissociation rate (a):

$$J\left(\frac{1-a}{1+a} N\right) \sigma - k\left(\frac{2a}{1+a} N\right)^2 = 0$$

J: the number of incident photons per unit time and unit area
N: density of $F_2$
$\sigma$: cross-section of photo dissociation of $F_2$
k: recombination constant of F Assuming that an ultraviolet laser beam with a wavelength of 2000 Å and a power of 10 W/cm² is applied to $F_2$ at $10^{-1}$ Torr, with $J=1\times10^{17}$, $N=4\times10^{15}$, $\sigma=10^{-16}$, and $k=8\times10^{-14}$: $a=0.1$ is obtained. This means that about 10% of the $F_2$ is dissociated optically into F under these conditions. By using light, which can be made monochromatic most easily, specific bonds in the particles of the material gas can be broken to provide specific reactive species relatively easily.

$F_2$ is employed in the above described example of the present invention. It is needless to say that the present invention is also effective for gases other than $F_2$.

Embodiments of the present invention will now be described in the following with reference to the drawings.

<EMBODIMENT 1>

Figure 2:
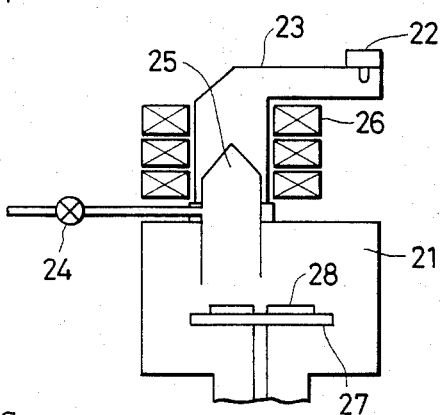
FIG. 2 is an illustration explaining a magneto-microwave plasma etching apparatus.
Figure 3:
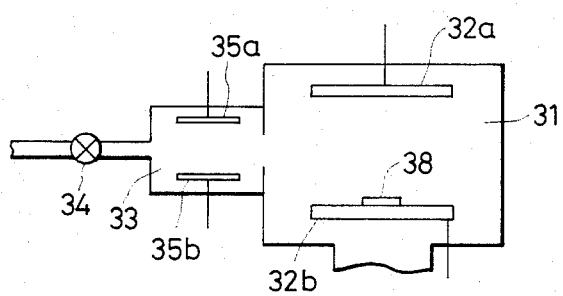
FIG. 3 is an illustration explaining a conventional etching apparatus with a preliminary excitation chamber wherein RF discharge is used.
Figure 4:
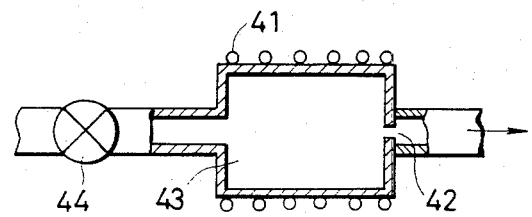
FIG. 4 is an illustration explaining a preliminary excitation mechanism, using heat, according to the present invention.

FIG. 4 illustrates schematically a means of preliminary excitation which excites and dissociates the atoms and molecules of material gas by heating. In this figure, a specimen reservoir 43 is connected to either of the surface treatment chambers 11 and 21 of FIGS. 1 and 2, respectively (the specimen reservoir is connected to the surface treatment chamber of any of the embodiments described below). The material gas excited and dissociated by heating it in the specimen reservoir 43 is introduced into the surface treatment chamber of the subsequent stage through a pinhole 42. The pinhole 42 is provided for differential pumping between the specimen reservoir 43 and the surface treatment chamber, since the pressures in these chambers are often very different from each other. A heater 41 is provided around the outer periphery of the sample reservoir 43, in contact therewith. The heater 41 must be able to heat the specimen reservoir 43 to at least about 1000° C.

<EMBODIMENT 2>

Figure 5:
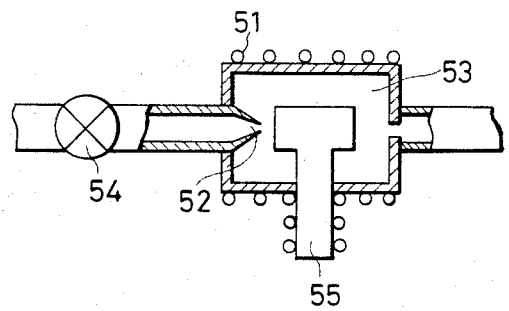

FIG. 5 shows an apparatus obtained by improving on the apparatus of Embodiment 1. Material gas blown through a nozzle 52 strikes against a heating plate 55 heated by a heater 51, and is thereby excited and dissociated more efficiently. The heating plate 55 is kept at about the same temperature as the inner wall of a specimen reservoir 53.

<EMBODIMENT 3>

Figure 6:
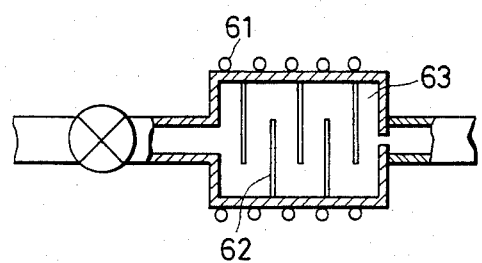

FIG. 6 also shows an improvement to the apparatus of Embodiment 1. Plates 62, which are heated by a heater 61 provided outside a specimen reservoir 63, are

installed in a staggered fashion within the reservoir 63. The presence of these plates 62 increases the occasions wherein the material gas comes into contact with a high-temperature part and, as a result, the particles of the material gas are excited and dissociated efficiently.

<EMBODIMENT 4>

Figure 7:
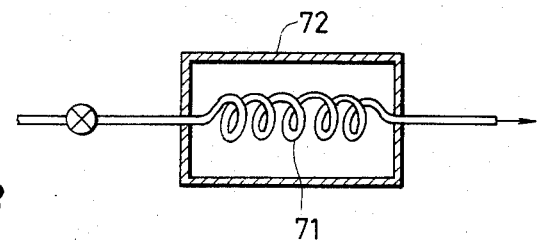

FIG. 7 shows an embodiment wherein no pinhole is provided. A spiral pipe 71 made of a material such as copper, which has an excellent heat conduction, is provided through a heating furnace 72 so as to heat the material gas passing therethrough, so that the gas is excited and dissociated.

<EMBODIMENT 5>

Figure 8:
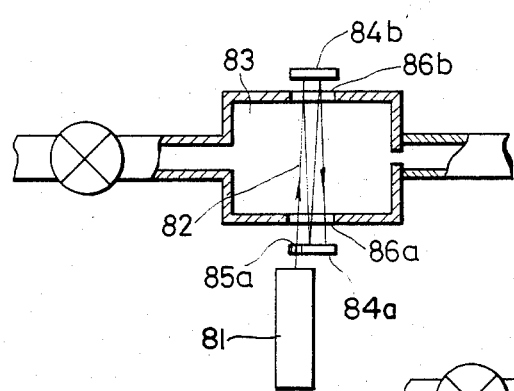

FIG. 8 shows a schematic view of an embodiment wherein the atoms and molecules of the material gas are excited and dissociated by light. In this embodiment, a laser 81 is employed as the light source. A laser beam 82 emitted from the laser 81 passes through a hole 85a made at one end of a reflector 84a and a window 86a provided in a specimen reservoir 83, to enter the reservoir 83. In the process, part of the laser beam is absorbed by the atoms and molecules of the material gas within the specimen reservoir 83, and excites and dissociates them. The rest of the beam passes through a window 86b, is reflected by a reflector 84b, and re-enters the specimen reservoir 83. The pair of reflectors 84a and 84b are installed to increase the efficiency of the optical excitation and dissociation.

<EMBODIMENT 6>

Figure 9:
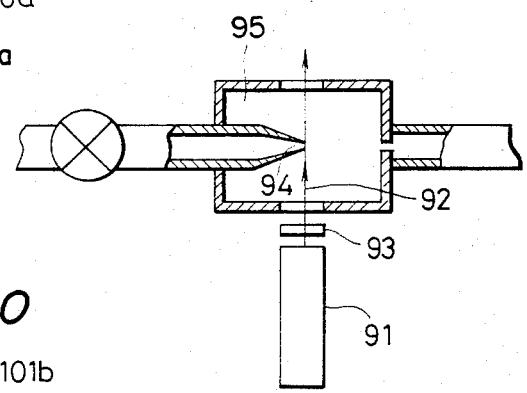

FIG. 9 shows a schematic view of an embodiment wherein a laser beam 92 condensed by lenses 93 is applied to material gas blown through a nozzle 94. The lenses 93 is provided between a laser 91 and a specimen reservoir 95. According to this embodiment, the density of the energy of the laser beam 92 is increased by focusing the laser beam with the lenses, and thereby the efficiency of the excitation and dissociation of the atoms and molecules of the gas can be increased.

<EMBODIMENT 7>

Figure 10:
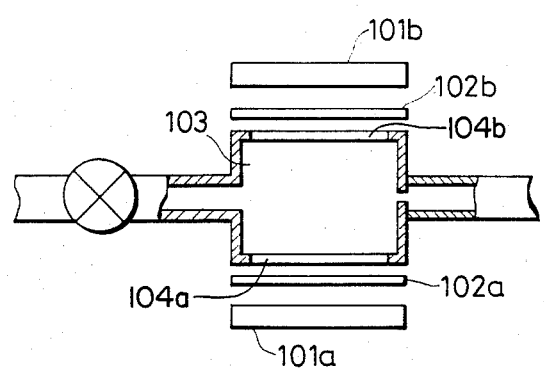

FIG. 10 shows an embodiment wherein lamps 101a and 101b are used as light sources. The range of the wavelengths can be selected by optical filters 102a and 102b, and the efficiency of the excitation and dissociation is also high. After passing through the optical filters 102a and 102b, light from the lamps 101a and 101b enters a specimen reservoir 103 through windows 104a and 104b provided in the reservoir 103, and excite and dissociate the gas.

<EMBODIMENT 8>

Figure 11:
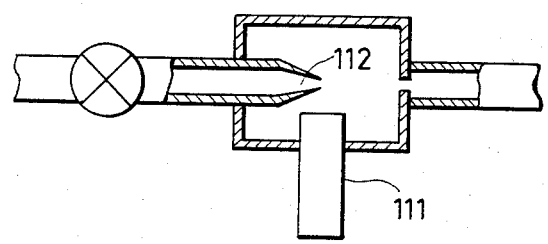

FIG. 11 shows an embodiment wherein an electron beam is used to excite and dissociate the gas. The monochromatic electron beam is applied from an electron beam source 111 to the material gas blown through a nozzle 112.

<EMBODIMENT 9>

Figure 12:
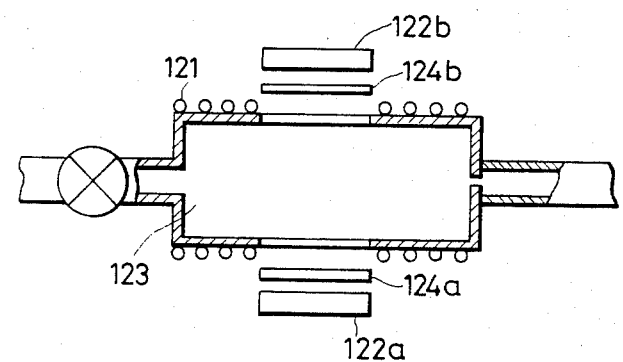

FIG. 12 illustrates one of the many combinations of Embodiments 1 to 8. The material gas introduced into a specimen reservoir 123 is heated by a heater 121 and simultaneously irradiated by light emitted from lamps 122a and 122b through optical filters 124a and 124b, respectively. In the present embodiment, the atoms and molecules of the gas are excited and dissociated simultaneously by the heating and lighting and thus the total efficiency of the excitation and dissociation increases.

A variety of composite embodiments other than this embodiment can be designed by combining Embodiments 1 to 8 with each other, and, of course, these composite embodiments are included within the scope of the present invention. The employment of the same means in a plurality of stages or in a plurality of units is also included therein.

What is claimed is:

1. A surface treatment apparatus wherein a material gas is introduced into a surface treatment chamber and activated therein, and wherein the surface of a specimen placed in said surface treatment chamber is treated by reactive species of said material gas generated by said activation, said surface treatment apparatus further comprising a preliminary chamber for receiving a material gas, means for supplying controllable energy through a wall of said preliminary chamber to said material gas to activate said material gas in a stage preceding said surface treatment chamber, and means for introducing the material gas containing particles thus activated into said surface treatment chamber wherein said initially activated material gas is further activated to treat the surface of said specimen.

2. The surface treatment apparatus according to claim 1, wherein said energy is thermal energy, and said material gas passing through said preliminary chamber is heated by heating means located outside said preliminary chamber.

3. The surface treatment apparatus according to claim 2, wherein a body with a heated surface is provided in the said preliminary chamber and is operatively associated with said heating means, and said material gas is made to strike against said body through a restricting means.

4. The surface treatment apparatus according to claim 2, wherein plates are arranged in a staggered manner in said preliminary chamber so as to increase the number of occasions wherein said material gas is in contact with a heated part within said preliminary chamber.

5. The surface treatment apparatus according to claim 1, wherein said material gas is activated by heat when it passes through said preliminary chamber in the form of a heated spiral pipe.

6. The surface treatment apparatus according to claim 1, wherein walls of said preliminary chamber include windows and a source of light irradiating said material gas through said windows in said preliminary chamber is provided so that said material gas is activated in said preliminary chamber by the light emitted from said source of light.

7. The surface treatment apparatus according to claim 6, characterized in that a reflecting means is provided at a position opposite to said light source.

8. The surface treatment apparatus according to claim 1, wherein a wall in said preliminary chamber includes a source of electron beams for directing the electron beams into said preliminary chamber so as to activate the gas therein.

9. The surface treatment apparatus according to claim 6, wherein an optical filter is disposed between said window and said source of light for selecting a particular wavelength.

10. The surface treatment apparatus according to claim 1, wherein said walls of said preliminary chamber include windows and said means for supplying the controllable energy includes a source of light irradiating said material gas through said windows and a source of thermal energy for heating said material gas to activate said material.

* * * * *